(12) United States Patent
Hwang et al.

(10) Patent No.: US 11,028,481 B2
(45) Date of Patent: Jun. 8, 2021

(54) SUBSTRATE TREATING APPARATUS AND METHOD

(71) Applicant: JUSUNG ENGINEERING CO., LTD., Gwangju-si (KR)

(72) Inventors: Chui Joo Hwang, Seongnam-si (KR); Jeung Hoon Han, Gwangju-si (KR); Young Hoon Kim, Uiwang-si (KR); Seung Hoon Seo, Gwangju-si (KR)

(73) Assignee: JUSUNG ENGINEERING CO., LTD.

(*) Notice: Subject to any disclaimer, the term of this patent is extended or adjusted under 35 U.S.C. 154(b) by 261 days.

(21) Appl. No.: 16/233,057

(22) Filed: Dec. 26, 2018

(65) Prior Publication Data
US 2019/0136379 A1 May 9, 2019

Related U.S. Application Data

(62) Division of application No. 14/404,449, filed on Nov. 26, 2014, now Pat. No. 10,202,690.

(30) Foreign Application Priority Data

May 30, 2012 (KR) .................. 10-2012-0057047

(51) Int. Cl.
*C23C 16/50* (2006.01)
*C23C 16/455* (2006.01)
(Continued)

(52) U.S. Cl.
CPC .......... *C23C 16/50* (2013.01); *C23C 16/455* (2013.01); *C23C 16/458* (2013.01);
(Continued)

(58) Field of Classification Search
None
See application file for complete search history.

(56) References Cited

U.S. PATENT DOCUMENTS

| | | |
|---|---|---|
| 5,651,867 A | 7/1997 | Kokaku et al. |
| 7,435,445 B2 | 10/2008 | Shin et al. |

(Continued)

FOREIGN PATENT DOCUMENTS

| | | |
|---|---|---|
| CN | 1735960 A | 2/2006 |
| EP | 2362001 A1 | 8/2011 |

(Continued)

*Primary Examiner* — Karla A Moore
(74) *Attorney, Agent, or Firm* — Renaissance IP Law Group LLP (57) ABSTRACT

Disclosed is an apparatus and method of processing substrate, which facilitates to improve deposition uniformity of a thin film deposited on a substrate, and to control quality of a thin film, wherein the apparatus includes a process chamber; a substrate supporter for supporting at least one of substrates, wherein the substrate supporter is provided in the bottom of the process chamber; a chamber lid confronting the substrate supporter, the chamber lid for covering an upper side of the process chamber; and a gas distributor for locally distributing activated source gas on the substrate, wherein the gas distributor locally confronting the substrate supporter is provided in the chamber lid, wherein the gas distributor forms plasma by the use of plasma formation gas, and activates the source gas by distributing the source gas to some of plasma area for formation of the plasma.

10 Claims, 5 Drawing Sheets

(51) Int. Cl.

| | |
|---|---|
| *C23C 16/509* | (2006.01) |
| *H01J 37/32* | (2006.01) |
| *C23C 16/458* | (2006.01) |
| *H01L 21/285* | (2006.01) |
| *H01L 21/3205* | (2006.01) |
| *H01L 21/67* | (2006.01) |
| *C23C 16/54* | (2006.01) |
| *H01L 21/02* | (2006.01) |

(52) U.S. Cl.
CPC .... *C23C 16/4584* (2013.01); *C23C 16/45536* (2013.01); *C23C 16/45544* (2013.01); *C23C 16/45551* (2013.01); *C23C 16/45563* (2013.01); *C23C 16/45574* (2013.01); *C23C 16/509* (2013.01); *C23C 16/5096* (2013.01); *H01J 37/3244* (2013.01); *H01J 37/32082* (2013.01); *H01J 37/32532* (2013.01); *H01L 21/28556* (2013.01); *H01L 21/32051* (2013.01); *C23C 16/54* (2013.01); *H01J 37/32752* (2013.01); *H01L 21/0262* (2013.01); *H01L 21/02532* (2013.01); *H01L 21/67155* (2013.01)

(56) References Cited

U.S. PATENT DOCUMENTS

| | | | |
|---|---|---|---|
| 10,202,690 B2 * | 2/2019 | Hwang | C23C 16/45544 |
| 2005/0016457 A1 | 1/2005 | Kawasaki et al. | |
| 2006/0177579 A1 | 8/2006 | Shin et al. | |
| 2010/0037820 A1 | 2/2010 | Lee | |
| 2010/0068413 A1 * | 3/2010 | Lee | C23C 16/50 427/569 |
| 2010/0097820 A1 | 4/2010 | Owen et al. | |
| 2011/0005681 A1 | 1/2011 | Savas et al. | |
| 2011/0036499 A1 * | 2/2011 | Lee | C23C 16/50 156/345.48 |
| 2012/0114877 A1 | 5/2012 | Lee | |
| 2012/0247390 A1 | 10/2012 | Sawada et al. | |
| 2013/0012029 A1 | 1/2013 | Vermeer et al. | |

FOREIGN PATENT DOCUMENTS

| | | |
|---|---|---|
| JP | 2003249492 A | 9/2003 |
| KR | 100552378 | 2/2006 |
| KR | 100874341 B1 | 12/2008 |
| KR | 20110008537 A | 1/2011 |
| KR | 20120012154 A | 2/2012 |
| WO | 2011033927 A1 | 3/2011 |

* cited by examiner

FIG. 8

SUBSTRATE TREATING APPARATUS AND METHOD

CROSS REFERENCE TO RELATED APPLICATIONS

This application is a divisional patent application of U.S. patent application Ser. No. 14/404,449, filed on Nov. 26, 2014, which claims the benefit of the Korean Patent Application No. 10-2012-0057047 filed on May 30, 2012, which is hereby incorporated by reference as if fully set forth herein.

BACKGROUND

Field of the Invention

The present invention relates to an apparatus and method of processing substrate which deposits a thin film on a substrate.

Discussion of the Related Art

Generally, in order to manufacture a solar cell, a semiconductor device and a flat panel display device, it is necessary to form a predetermined thin film layer, a thin film circuit pattern or an optical pattern on a surface of a substrate. Thus, a semiconductor manufacturing process may be carried out, for example, a thin film deposition process of depositing a thin film of a predetermined material on a substrate, a photo process of selectively exposing the thin film by the use of photosensitive material, and an etching process of forming a pattern by selectively removing an exposed portion of the thin film.

The semiconductor manufacturing process is performed inside a substrate processing apparatus designed to be suitable for optimal circumstances. Recently, a substrate processing apparatus using plasma is generally used to carry out a deposition or etching process.

This semiconductor manufacturing process using plasma may be a PECVD (Plasma Enhanced Chemical Vapor Deposition) apparatus for forming a thin film, and a plasma etching apparatus for etching and patterning the thin film.

Figure 1:
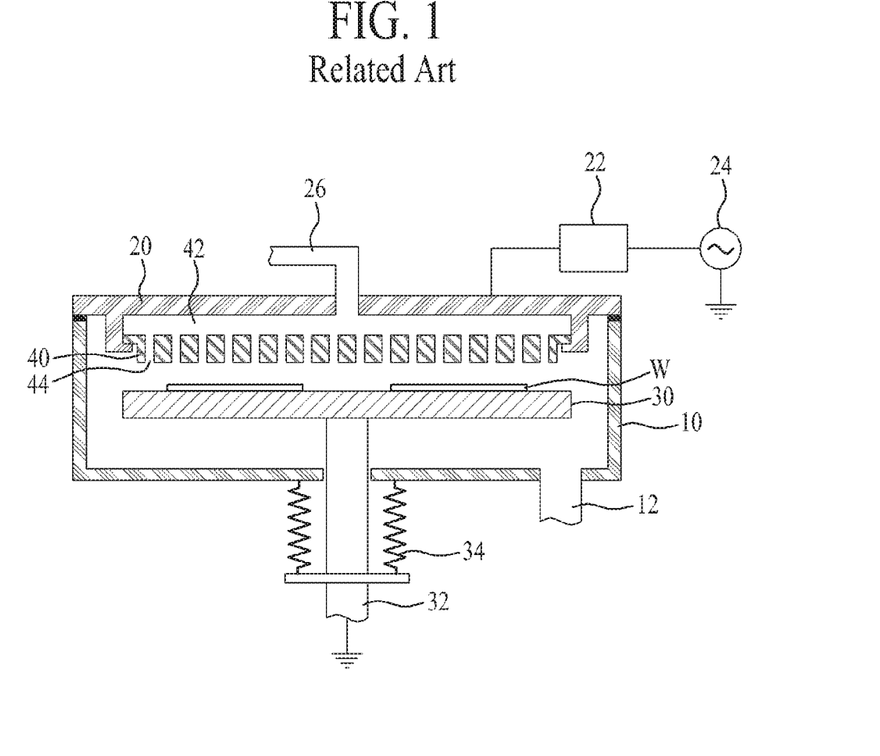
FIG. 1 illustrates a substrate processing apparatus according to the related art.

FIG. 1 illustrates a substrate processing apparatus according to the related art.

Referring to FIG. 1, the substrate processing apparatus according to the related art may include a chamber 10, a plasma electrode 20, a susceptor 30, and a gas distributing means 40.

The chamber 10 provides a reaction space for substrate processing. In this case, a predetermined portion of a bottom surface of the chamber 10 is communicated with an exhaust pipe 12 for discharging gas from the reaction space.

The plasma electrode 20 is provided on the chamber 10 so as to seal the reaction space.

One side of the plasma electrode 20 is electrically connected with a RF (Radio Frequency) power source 24 through a matching member 22. The RF power source 24 generates RF power, and supplies the generated RF power to the plasma electrode 20.

Also, a central portion of the plasma electrode 20 is communicated with a gas supply pipe 26 of supplying source gas for the substrate processing.

The matching member 22 is connected between the plasma electrode 20 and the RF power source 24, to thereby match load impedance and source impedance of the RF power supplied from the RF power source 24 to the plasma electrode 20.

The susceptor 30 is provided inside the chamber 10, and the susceptor 30 supports a plurality of substrates W loaded from the external. The susceptor 30 corresponds to an opposite electrode in opposite to the plasma electrode 20, and the susceptor 30 is electrically grounded by an elevating axis 32 for elevating the susceptor 30.

The elevating axis 32 is moved up and down by an elevating apparatus (not shown). In this case, the elevating axis 32 is surrounded by a bellows 34 for sealing the elevating axis 32 and the bottom surface of the chamber 10.

The gas distributing means 40 is provided below the plasma electrode 20, wherein the gas distributing means 40 confronts with the susceptor 30. In this case, a gas diffusion space 42 is formed between the gas distributing means 40 and the plasma electrode 20. Inside the gas diffusion space 42, the source gas supplied from the gas supply pipe 26 penetrating through the plasma electrode 20 is diffused. The gas distributing means 40 uniformly distributes the source gas to the entire area of the reaction space through a plurality of gas distributing holes 44 being communicated with the gas diffusion space 42.

In case of the substrate processing apparatus according to the related art, after the substrate (W) is loaded onto the susceptor 30, the predetermined source gas is distributed to the reaction space of the chamber 10, and the RF power is supplied to the plasma electrode 20 so as to form the plasma in the reaction space between the susceptor 30 and the gas distributing means 40, to thereby deposit a source material of the source gas on the substrate (W) by the use of plasma.

However, the substrate processing apparatus according to the related art may have the following problems.

First, a density of the plasma formed on the entire area of the susceptor 30 is not uniform so that a uniformity of the thin film material deposited on the substrate (W) is deteriorated, and it is difficult to control quality of the thin film.

Also, since the plasma is formed on the entire area of the susceptor 30, a thickness of the source material deposited on the chamber 10 as well as a thickness of the source material deposited on the substrate (W) may be rapidly increased so that a cleaning cycle of the chamber 10 is shortened.

SUMMARY

Accordingly, the present invention is directed to an apparatus and method of processing substrate that substantially obviates one or more problems due to limitations and disadvantages of the related art.

An aspect of the present invention is to provide an apparatus and method of processing substrate, which facilitates to improve deposition uniformity of a thin film deposited on a substrate, and to control quality of a thin film.

Another aspect of the present invention is to provide an apparatus and method of processing substrate, which overcomes a problem of particles by minimizing an accumulation thickness of particles deposited on a process chamber.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a substrate processing apparatus comprising a process chamber; a substrate supporter for supporting at least one of substrates, wherein the substrate supporter is provided in the bottom of the process chamber; a chamber lid confronting the substrate supporter, the chamber lid for covering an upper side of the process chamber; and a gas distributor for locally distributing activated source gas on the substrate, wherein the gas distributor locally confronting the substrate supporter is provided in the chamber lid, wherein the gas distributor forms plasma by the use of plasma formation gas, and activates the source gas by distributing the source gas to some of plasma area for formation of the plasma.

In another aspect of the present invention, there is provided a substrate processing apparatus comprising a process chamber; a substrate supporter for supporting at least one of substrates, wherein the substrate supporter is provided in the bottom of the process chamber; a chamber lid confronting the substrate supporter, the chamber lid for covering an upper side of the process chamber; and a gas distributor for locally distributing activated source gas on the substrate, wherein the gas distributor locally confronting the substrate supporter is provided in the chamber lid, and is formed to include a plasma formation space prepared between a plasma electrode and a ground electrode, and a source gas distribution space spatially separated from the plasma formation space, wherein the gas distributor distributes source gas to some of plasma area formed to include a lower area of the source gas distribution space through the source gas distribution space, and thus activates the source gas.

In another aspect of the present invention, there is provided a substrate processing apparatus comprising a process chamber; a substrate supporter for supporting at least one of substrates, wherein the substrate supporter is provided in the bottom of the process chamber; a chamber lid confronting the substrate supporter, the chamber lid for covering an upper side of the process chamber; and a gas distributor for locally distributing activated source gas on the substrate, wherein the gas distributor locally confronting the substrate supporter is provided in the chamber lid, wherein the gas distributor forms plasma between plasma and ground electrodes arranged in parallel, and distributes source gas to a plasma overlapping area for formation of the plasma, and thus activates the source gas.

In another aspect of the present invention, there is provided a substrate processing method comprising placing at least one substrate on a substrate supporter provided inside a process chamber; and locally distributing activated source gas on the substrate by the use of gas distributor which locally confronts the substrate supporter and is provided in a chamber lid for covering the process chamber, wherein the gas distributor forms plasma by the use of plasma formation gas, and distributes source gas to a plasma overlapping area for formation of the plasma, and thus activates the source gas.

In a further aspect of the present invention, there is provided a substrate processing method comprising placing at least one substrate on a substrate supporter provided inside a process chamber; and locally distributing activated source gas on the substrate by the use of gas distributor which locally confronts the substrate supporter and is provided in a chamber lid for covering the process chamber, wherein the step of locally distributing the activated source gas on the substrate includes forming plasma between plasma and ground electrodes arranged in parallel, and distributing source gas to a plasma overlapping area for formation of the plasma, and thus activating the source gas.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

Figure 2:
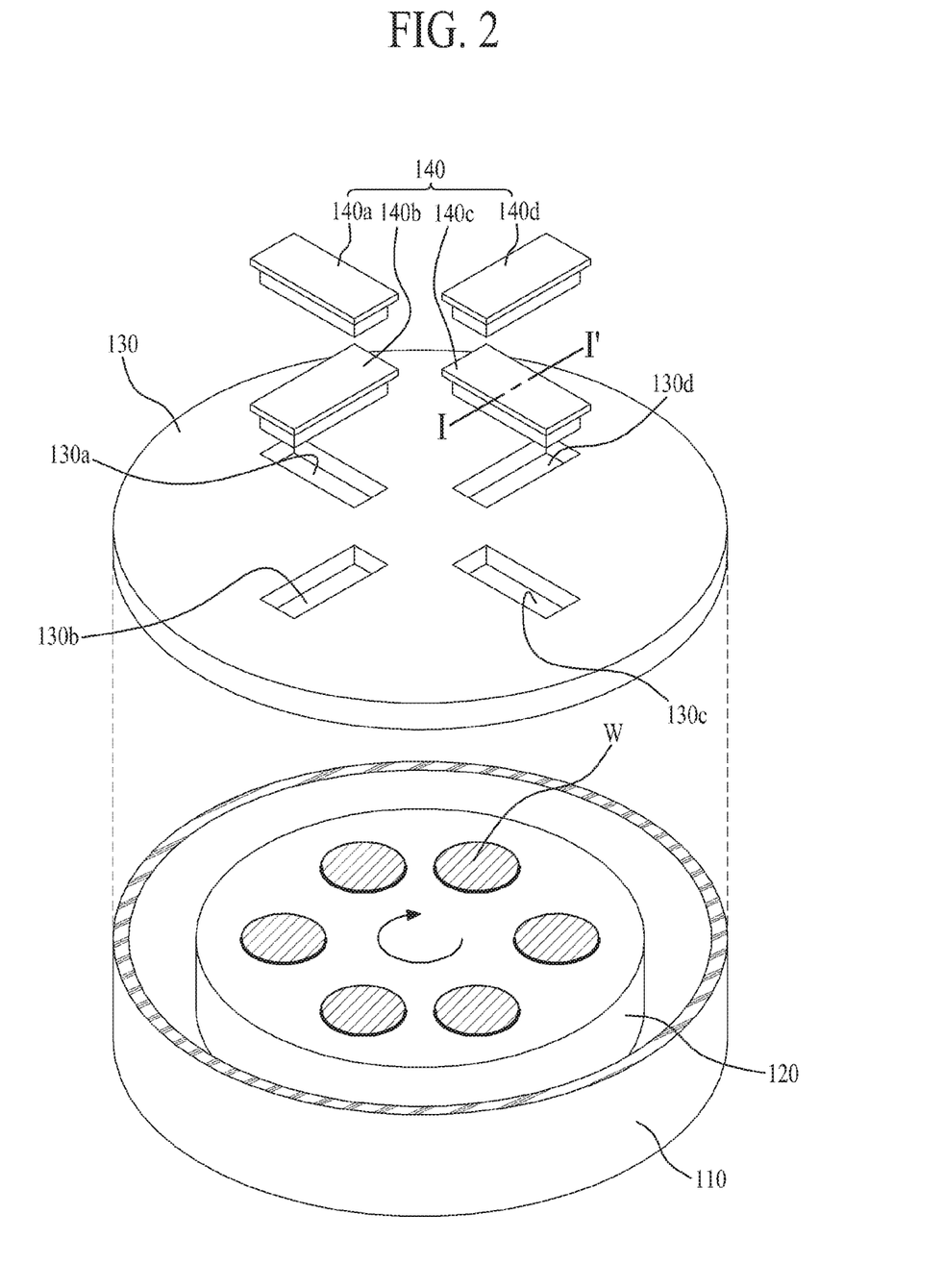
FIG. 2 is a perspective view illustrating a substrate processing apparatus according to the embodiment of the present invention.

FIG. 2 is a perspective view illustrating a substrate processing apparatus according to the embodiment of the present invention.

Referring to FIG. 2, the substrate processing apparatus according to the embodiment of the present invention may include a process chamber 110; a substrate supporter 120 provided on the bottom of the process chamber 110, wherein the substrate supporter 120 supports at least one substrate (W) thereon; a chamber lid 130 for covering an upper side of the process chamber 110; and a gas distributor 140 for distributing activated source gas on the substrate (W), wherein the gas distributor 140 locally confronting the chamber lid 130 is provided in the chamber lid 130.

The process chamber 110 provides a reaction space for substrate processing, for example, a thin film deposition process. A bottom surface and/or a lateral surface of the process chamber 110 may be communicated with an exhaust port (not shown) for discharging gas from the reaction space.

The substrate supporter 120 is rotatably provided in the inner bottom of the process chamber 110. The substrate supporter 120 is supported by a rotation axis (not shown) penetrating through a central portion of the bottom surface of the process chamber 110, and the substrate supporter 120 may be electrically floating or grounded. In this case, the rotation axis exposed out of the bottom surface of the process chamber 100 is sealed by a bellows (not shown) provided in the bottom surface of the process chamber 110.

The substrate supporter 120 supports at least one substrate (W) loaded by an external substrate loading apparatus (not shown). The substrate supporter 120 may be formed in shape of a circular plate. The substrate (W) may be a semiconductor substrate or a wafer. In this case, it is preferable that the plurality of substrates (W) be arranged at fixed intervals in a circular pattern on the substrate supporter 120 so as to improve the yield.

According as the substrate supporter 120 is rotated to a predetermined direction (for example, clockwise direction) by rotation of the rotation axis, the substrate (W) is rotated and thus is moved in accordance with a predetermined order so that the substrate (W) is sequentially exposed to the activated source gas which is locally distributed from the gas distributor 140. Accordingly, the substrate (W) is sequentially exposed to the activated source gas in accordance with rotation of the substrate supporter 120 and its rotation speed, whereby a single-layered or multi-layered thin film is deposited on the substrate (W) by ALD (Atomic Layer Deposition) or CVD (Chemical Vapor Deposition).

The chamber lid 130 is provided on the process chamber 110, that is, the chamber lid 130 covers the upper side of the process chamber 110. The chamber lid 130 supports the gas distributor 140, wherein the chamber lid 130 includes a plurality of module receivers 130a, 130b, 130c and 130d provided at fixed intervals, for example, a radial pattern, and each part of the gas distributor 140 is inserted into each of the module receivers 130a, 130b, 130c and 130d. The plurality of module receivers 130a, 130b, 130c and 130d may be symmetrically provided in a diagonal direction with respect to a central point of the chamber lid 130, that is, may be disposed every 90°.

As shown in the drawings, the process chamber 110 and the chamber lid 130 may be formed in the circular shape, but not limited to the circular shape. For example, the process chamber 110 and the chamber lid 130 may be formed in a polygonal shape such as hexagon, or an oval shape. If the process chamber 110 and the chamber lid 130 are formed in the polygonal shape such as hexagon, the process chamber 110 is provided in such a way that a plurality of sections obtained by dividing the process chamber 110 are combined with one another.

In FIG. 2, the chamber lid 130 includes the four module receivers 130a, 130b, 130c and 130d, but not limited to the four. For example, the chamber lid 130 may include 2N ('N' is an integer above 0) module receivers symmetrically provided with respect to the central point of the chamber lid 130. In this case, the plurality of module receivers may be mutually symmetric in the diagonal direction with respect to the central point of the chamber lid 130. Hereinafter, it is assumed that the chamber lid 130 includes the first to fourth module receivers 130a, 130b, 130c and 130d.

The gas distributor 140 locally confronting the substrate supporter 120 is provided in the chamber lid 130, wherein the gas distributor 140 distributes the activated source gas on the substrate (W). That is, the gas distributor 140 forms plasma by the use of plasma formation gas, and distributes the source gas to some of plasma area with the plasma, to thereby activate the source gas. Accordingly, the source gas distributed from the gas distributor 140 is activated by the plasma formed in some of the plasma area, and the activated source gas is distributed on the substrate (W), whereby a predetermined thin film is formed on the upper surface of the substrate (W).

The gas distributor 140 includes first to fourth gas distribution modules 140a, 140b, 140c and 140d which are respectively inserted into the first to fourth module receivers 130a, 130b, 130c and 130d while locally confronting different areas of the substrate supporter 120.

Figure 3:
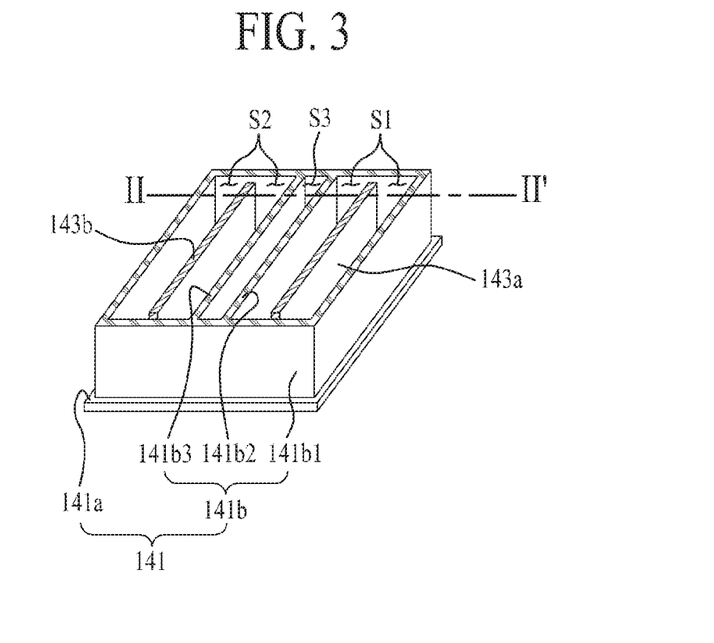
FIG. 3 is a rear perspective view illustrating a gas distribution module shown in FIG. 2.
Figure 4:
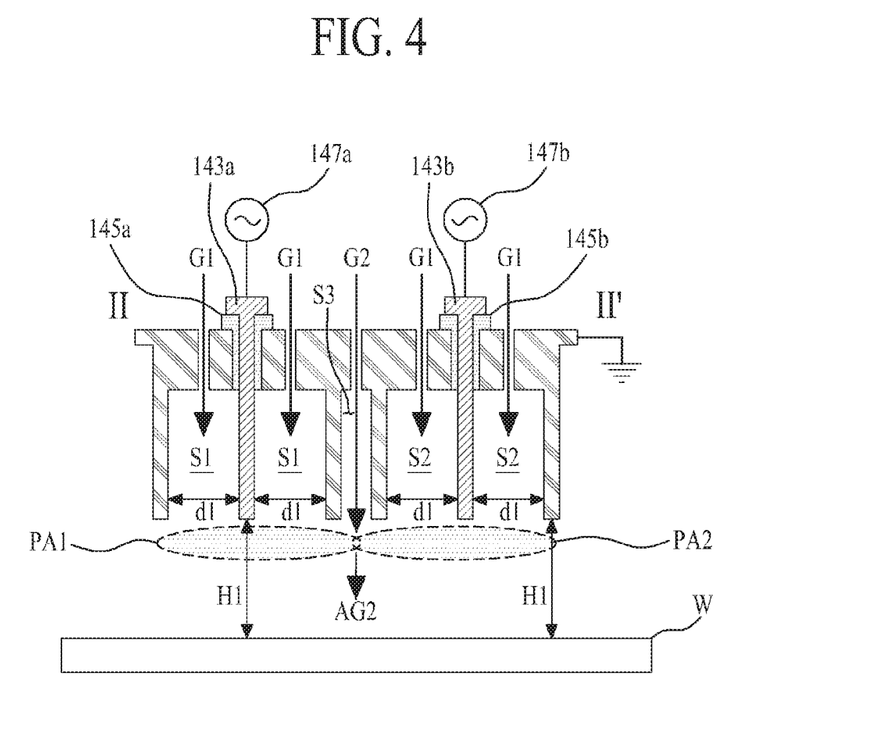
FIG. 4 is a cross sectional view along II-II' of FIG. 3.

FIG. 3 is a rear perspective view illustrating a gas distribution module shown in FIG. 2. FIG. 4 is a cross sectional view along II-II' of FIG. 3.

Referring to FIGS. 3 and 4 in connection with FIG. 2, each of the first to fourth gas distribution modules 140a, 140b, 140c and 140d may include a housing 141, first and second plasma electrodes 143a and 143b, and first and second insulating members 145a and 145b.

The housing 141 may include a ground plate 141a placed onto the upper surface of the chamber lid 130, and a plurality of ground electrodes 141b protruding from the lower surface of the ground plate 141a, wherein the plurality of ground electrodes 141b having a predetermined height form a first plasma formation space (S1), a second plasma formation space (S2), and a source gas distribution space (S3) which are spatially separated from one another.

The ground plate 141a is placed onto the upper surface of the chamber lid 130, and is connected with the upper surface of the chamber lid 130 by a plurality of coupling members (not shown) such as blot or screw, whereby the ground plate 141a is electrically grounded through the chamber lid 130.

The plurality of ground electrodes 141b may include four ground sidewalls 141b1 protruding from the lower edge of the ground plate 141a; and first and second ground partitions 141b2 and 141b3 provided to spatially separate the space prepared by the four ground sidewalls 141b1 into the first plasma formation space (S1), the second plasma formation spaces (S2), and the source gas distribution space (S3).

The first plasma formation space (S1) is prepared between the ground sidewall 141b1 and the first ground partition 141b2, and the second plasma formation space (S2) is prepared between the ground sidewall 141b1 and the second ground partition 141b3. Each of the first and second plasma formation spaces (S1, S2) is formed in a polygonal shape whose length is larger than a length of the substrate (W). Each of the first and second plasma formation spaces (S1, S2) is communicated with a plurality of first gas supplying holes formed in the upper surface of the housing 141, that is, the ground plate 141a, and is also supplied with plasma formation gas (G1) from a first gas supplier (not shown) through a first gas supplying pipe (not shown) connected with the plurality of first gas supplying holes. The plasma formation gas (G1) may be inert gas such as argon (Ar) or nitrogen (N2), reactant gas such as hydrogen (H2), nitrogen (N2), oxygen (O2), nitrogen dioxide (N2O) and ozone (O3), or mixed gas of the inert gas and the reactant gas.

The source gas distribution space (S3) is prepared between the first and second ground partitions 141b2 and 141b3, to thereby spatially separate the first and second plasma formation spaces (S1, S2) from each other. The source gas distribution space (S3) is communicated with a plurality of second gas supplying holes formed in the upper surface of the housing 141, that is, the ground plate 141a, and is also supplied with source gas (G2) from a second gas supplier (not shown) through a second gas supplying pipe (not shown) connected with the plurality of second gas supplying holes. The source gas (G2) may include a thin film material to be deposited on the substrate (W). The source gas (G2) may include the thin film material of silicon (Si), titanium family element (Ti, Zr, Hf, and etc.), or aluminum (Al). For example, the source gas (G2) including the thin film material of silicon (Si) may be the gas selected from silane (SiH4), disilane (Si2H6), trisilane (Si3H8), TEOS (Tetraethylorthosilicate), DCS (Dichlorosilane), HCD (Hexachlorosilane), TriDMAS (Tri-dimethylaminosilane), TSA (Trisilylamine), and etc.

The source gas (G2) may be mixed with the reactant gas such as hydrogen (H2), nitrogen (N2), oxygen (O2), nitrogen dioxide (N2O) and ozone (O3).

In FIG. 3, the source gas distribution space (S3) is provided in a type of slit, but not limited to this shape. For example, the lower surface of the source gas distribution space (S3) may include a plurality of source gas distribution holes (not shown). That is, the lower surface of the source gas distribution space (S3) may be provided with a shower head having a plurality of source gas distribution holes.

The first plasma electrode 143a is inserted into the first plasma formation space (S1) while being electrically insulated from the housing 141, and is also arranged in parallel to the first ground partition 141b2. In this case, a distance (d1) between the first plasma electrode 143a and the first ground partition 141b2 or a distance (d1) between the first plasma electrode 143a and the ground sidewall 141b1 is smaller than a height (H1) between the first plasma electrode 143a and the substrate (W). In this case, since an electric field is not formed between the substrate (W) and the first plasma electrode 143a, it is possible to prevent the substrate (W) from being damaged by the plasma formed by the use of electric field.

The first plasma electrode 143a is electrically connected with a first plasma power supplier 147a, and is supplied with a first plasma power from the first plasma power supplier 147a. In this case, a first feed member (not shown) for electrically connecting the first plasma electrode 143a with the first plasma power supplier 147a may be connected with an impedance matching circuit (not shown). The impedance matching circuit matches source impedance and load impedance of the first plasma power supplied to the first plasma electrode 143a from the first plasma power supplier 147a. The impedance matching circuit may include at least two of impedance element (not shown) formed of at least one of variable capacitor and variable inductor.

The first plasma power may be high frequency power or radio frequency (RF) power, for example, lower frequency (LF) power, middle frequency (MF) power, high frequency (HF) power, or very high frequency (VHF) power. In this case, the LF power may have 3 kHz~300 kHz frequency, the MF power may have 300 kHz~3 MHz frequency, the HF power may have 3 MHz~30 MHz frequency, and the VHF power may have 30 MHz~300 MHz frequency.

The first plasma electrode 143a forms first plasma by the use of plasma formation gas (G1) supplied in the first plasma formation space (S1) according to the first plasma power. In this case, a first plasma area (PA1) for forming the first plasma includes an area positioned adjacent to a lower end of the first plasma electrode 143a and a lower end of the ground electrode 141b, and some of a lower area of the source gas distribution space (S3) by the electric field formed between the first plasma electrode 143a and the ground electrode 141b. That is, if the distance (d1) between the first plasma electrode 143a and the ground electrode 141b is not more than a predetermined distance, the plasma is not formed in the space between the first plasma electrode 143a and the ground electrode 141b. If the distance (d1) between the first plasma electrode 143a and the ground electrode 141b is small, and the plasma formation gas (G1) is distributed to the space between the first plasma electrode 143a and the ground electrode 141b, the plasma is formed in the area positioned adjacent to the lower end of the first plasma electrode 143a and the lower end of the ground electrode 141b, and some of the lower area of the source gas distribution space (S3). According as the source gas (G2) is distributed from the source gas distribution space (S3), the source gas (G2) is limitedly activated (or activated at minimum), whereby it is possible to minimize a deposition of the activated source gas on a portion adjacent to the electrode. Also, some of the source gas (G2) is activated and distributed on the substrate (W), whereby it is possible to improve a deposition efficiency in comparison to a process of depositing the source gas (G2) without activation.

The second plasma electrode 143b is inserted into the second plasma formation space (S2) while being electrically insulated from the housing 141, and is also arranged in parallel to the second ground partition 141b3. In this case, a distance (d1) between the second plasma electrode 143b and the second ground partition 141b3 or a distance (d1) between the second plasma electrode 143b and the ground sidewall 141b1 is smaller than a height (H1) between the second plasma electrode 143b and the substrate (W). In this case, since an electric field is not formed between the substrate (W) and the second plasma electrode 143b, it is possible to prevent the substrate (W) from being damaged by the plasma formed by the use of electric field.

The second plasma electrode 143b is electrically connected with a second plasma power supplier 147b, and is supplied with a second plasma power from the second plasma power supplier 147b. In this case, a second feed member (not shown) for electrically connecting the second plasma electrode 143b with the second plasma power supplier 147b may be connected with the aforementioned impedance matching circuit (not shown).

The second plasma power may be high frequency power or radio frequency (RF) power which is the same as or different from the first plasma power. If the second plasma power is the same as the first plasma power, both the first plasma power and the second plasma power may be supplied by the use of one plasma power supplier.

The second plasma electrode 143b forms second plasma by the use of plasma formation gas (G1) supplied in the second plasma formation space (S2) according to the second plasma power. In this case, a second plasma area (PA2) for forming the second plasma includes an area positioned adjacent to a lower end of the second plasma electrode 143b and a lower end of the ground electrode 141b, and some of a lower area of the source gas distribution space (S3) by the electric field formed between the second plasma electrode 143b and the ground electrode 141b, in the same manner as the aforementioned first plasma.

The source gas distribution space (S3) may be partially overlapped with the first plasma area (PA1) and/or the second plasma area (PA2), or may be overlapped with an overlapping area of the first and second plasma areas (PA1, PA2). Thus, according as the source gas (G2) supplied to the source gas distribution space (S3) is distributed to the first plasma area (PA1) and/or the second plasma area (PA2), or the overlapping area of the first and second plasma areas (PA1, PA2), the source gas (G2) is activated by the plasma of the first and second plasma areas (PA1, PA2), whereby the activated source gas (AG2) is distributed on the substrate (W).

The first insulating member 145a is inserted into a first insulating member insertion hole formed in the housing 141, whereby the first plasma electrode 143a is electrically insulated from the housing 141. The first insulating member 145a includes an electrode insertion hole into which the first plasma electrode 143a is inserted.

The second insulating member 145b is inserted into a second insulating member insertion hole formed in the housing 141, whereby the second plasma electrode 143b is electrically insulated from the housing 141. The second insulating member 145b includes an electrode insertion hole into which the second plasma electrode 143b is inserted.

Figure 5:
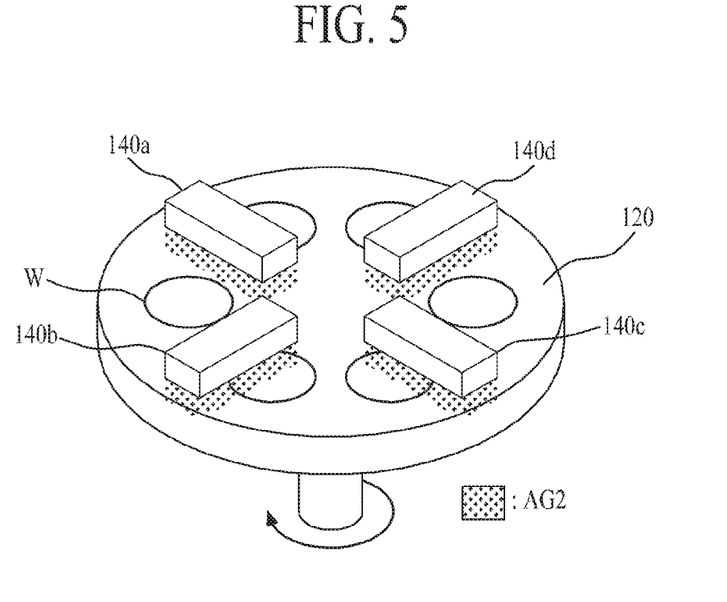
FIG. 5 illustrates a substrate processing method using the substrate processing apparatus according to the embodiment of the present invention.

FIG. 5 illustrates a substrate processing method using the substrate processing apparatus according to the embodiment of the present invention.

The substrate processing method using the substrate processing apparatus according to the embodiment of the present invention will be described with reference to FIG. 5 in connection with FIG. 4.

First, the plurality of substrates (W) are loaded at fixed intervals and placed onto the substrate supporter 120.

Then, the substrate supporter 120 having the plurality of substrates (W) loaded and placed thereonto is rotated to the predetermined direction (for example, clockwise direction).

According as the plasma power and the plasma formation gas (G1) are supplied to the respective first to fourth gas distribution modules 140a, 140b, 140c and 140d, the plasma is formed inside each of the first to fourth gas distribution modules 140a, 140b, 140c and 140d, and the source gas (G2) is distributed to some area of the plasma, whereby the source gas (G2) is activated, and the activated source gas (AG2) is downwardly distributed and locally provided on the substrate supporter 120.

In more detail, the plasma formation gas (G1) is supplied to the first and second plasma formation spaces (S1, S2) in each of the first to fourth gas distribution modules 140a, 140b, 140c and 140d; and the plasma power is supplied to the first and second plasma electrodes 143a and 143b in each of the first to fourth gas distribution modules 140a, 140b, 140c and 140d, whereby the plasma is formed in the lower area of the first and second plasma formation spaces (S1, S2) and the lower area of the source gas distribution space (S3). Subsequently, according as the source gas (G2) is supplied to the source gas distribution space (S3) of each of the first to fourth gas distribution modules 140a, 140b, 140c and 140d, the source gas (G2) is distributed to the plasma formed in the lower area of the source gas distribution space (S3). Thus, the source gas (G2) is activated by the plasma while the source gas (G2) passes through the plasma formed in the lower area of the source gas distribution space (S3), and the activated source gas (AG2) is distributed on the substrate (W) by the flux of the source gas (G2) supplied to the source gas distribution space (S3).

Accordingly, each of the plurality of substrates (W) placed onto the substrate supporter 120 sequentially passes through the respective lower areas of the first to fourth gas distribution modules 140a, 140b, 140c and 140d by rotation of the substrate supporter 120, whereby each of the substrates (W) is exposed to the activated source gas (AG2), and thus a predetermined thin film is deposited on each of the substrates (W) by the activated source gas (AG2).

Figure 6:
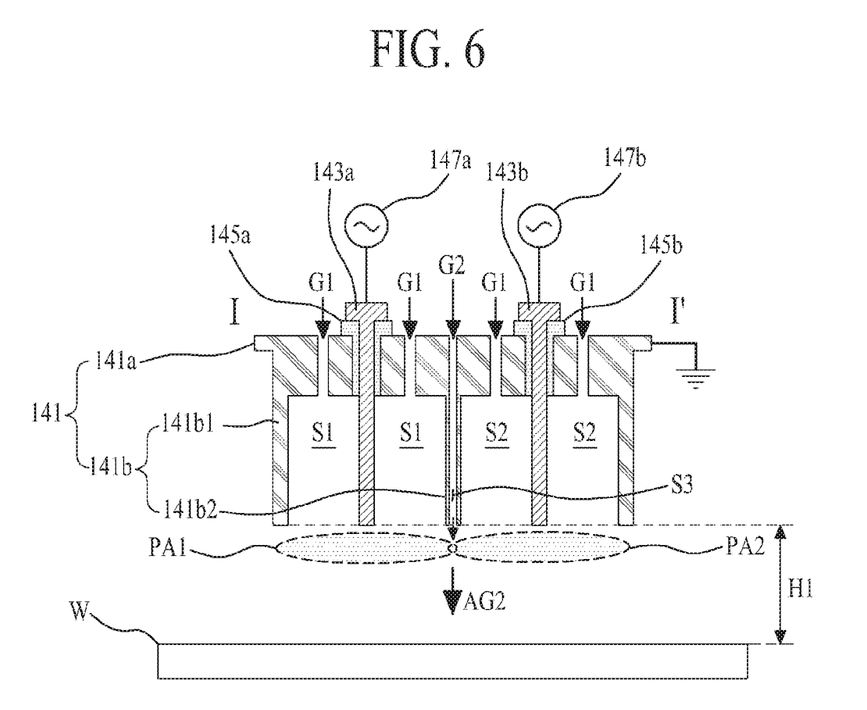
FIG. 6 is a cross sectional view along I-I' of FIG. 2, which shows a first modified embodiment of a gas distribution module.

FIG. 6 is a cross sectional view along I-I' of FIG. 2, which shows a first modified embodiment of a gas distribution module.

Referring to FIG. 6 in connection with FIG. 2, each of gas distribution modules 140a, 140b, 140c and 140d according to the first modified embodiment of the present invention may include a housing 141, first and second plasma electrodes 143a and 143b, and first and second insulating members 145a and 145b.

The housing 141 may include a ground plate 141a placed onto an upper surface of a chamber lid 130, and a plurality of ground electrodes 141b protruding from a lower surface of the ground plate 141a, wherein the plurality of ground electrodes 141b having a predetermined height form first and second plasma formation spaces (S1, S2) which are spatially separated from each other.

The ground plate 141a is placed onto the upper surface of the chamber lid 130, and is connected with the upper surface of the chamber lid 130 by a plurality of coupling members (not shown) such as blot or screw, whereby the ground plate 141a is electrically grounded through the chamber lid 130.

The plurality of ground electrodes 141b may include four ground sidewalls 141b1 protruding from the lower edge of the ground plate 141a; and a ground partition 141b1 for dividing a space prepared by the four ground sidewalls 141b1 so as to form the first and second plasma formation spaces (S1, S2) spatially separated from each other, and also to form a source gas distribution space (S3) thereinside.

The first plasma formation space (S1) is prepared at one side of the ground sidewall 141b1 and the ground partition 141b2, and the second plasma formation space (S2) is prepared at the other side of the ground sidewall 141b1 and the ground partition 141b2. Each of the first and second plasma formation spaces (S1, S2) is communicated with a plurality of first gas supplying holes formed in the upper surface of the housing 141, that is, the ground plate 141a, and is supplied with the aforementioned plasma formation gas (G1) from a first gas supplier (not shown) through a first gas supplying pipe (not shown) connected with the plurality of first gas supplying holes.

The source gas distribution space (S3) is prepared inside the ground partition 141b2 so as to spatially separate the first and second plasma formation spaces (S1, S2) from each other. The source gas distribution space (S3) is communicated with a plurality of second gas supplying holes formed in the upper surface of the housing 141, that is, the ground plate 141a, and is supplied with the aforementioned source gas (G2) from a second gas supplier (not shown) through a second gas supplying pipe (not shown) connected with the plurality of second gas supplying holes.

In FIG. 6, the source gas distribution space (S3) is provided in a type of slit, but not limited to this shape. For example, the lower surface of the source gas distribution space (S3) may include a plurality of source gas distribution holes (not shown).

The first and second plasma electrodes 143a and 143b are respectively inserted into the first and second plasma formation spaces (S1, S2), which are the same as those of the FIG. 4, whereby a detailed explanation for the same structures will be omitted.

The first plasma electrode 143a forms first plasma by the use of plasma formation gas (G1) supplied to the first plasma formation space (S1) according to first plasma power. Accordingly, a first plasma area (PA1) for forming the first plasma includes an area positioned adjacent to a lower end of the first plasma electrode 143a and a lower end of the ground electrode 141b, and some of a lower area of the source gas distribution space (S3), that is, some of a lower area of the ground partition 141b2 by an electric field formed between the first plasma electrode 143a and the ground electrode 141b according to the first plasma power.

In the same manner, the second plasma electrode 143b forms second plasma by the use of plasma formation gas (G1) supplied to the second plasma formation space (S2) according to second plasma power. Accordingly, a second plasma area (PA2) for forming the second plasma includes an area positioned adjacent to a lower end of the second plasma electrode 143b and a lower end of the ground electrode 141b, and some of a lower area of the source gas distribution space (S3), that is, some of a lower area of the ground partition 141b2 by an electric field formed between the second plasma electrode 143b and the ground electrode 141b according to the second plasma power.

The source gas distribution space (S3) may be partially overlapped with the first plasma area (PA1) and/or the second plasma area (PA2), or may be overlapped with an overlapping area of the first and second plasma areas (PA1, PA2). Thus, according as the source gas (G2) supplied to the source gas distribution space (S3) is distributed to the first plasma area (PA1) and/or the second plasma area (PA2), or the overlapping area of the first and second plasma areas (PA1, PA2), the source gas (G2) is activated by the plasma of the first and second plasma areas (PA1, PA2), whereby the activated source gas (AG2) is distributed on the substrate (W).

Figure 7:
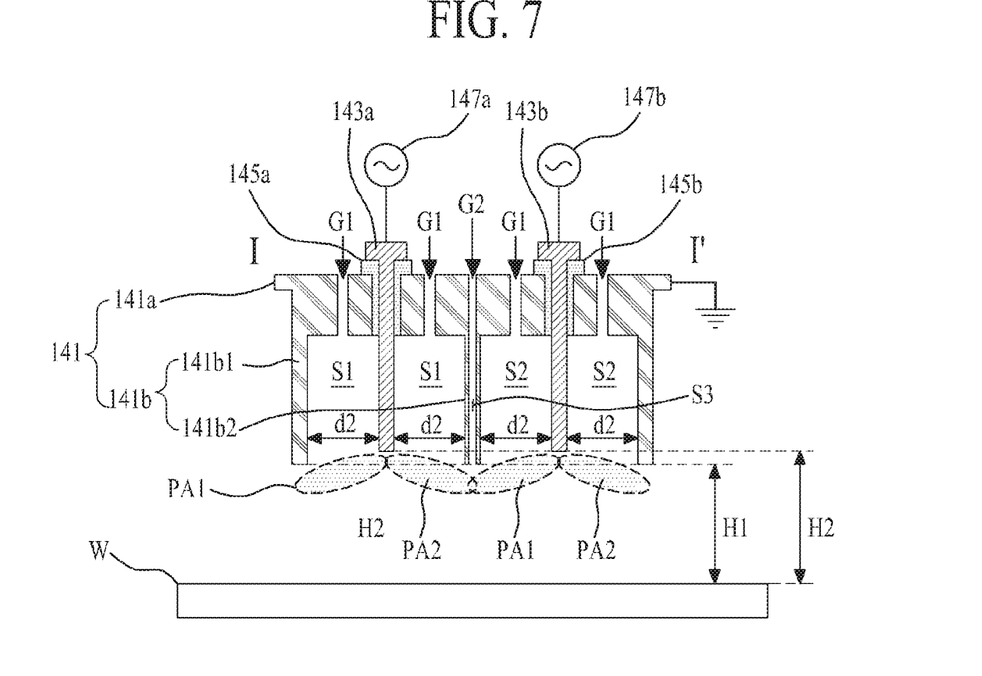
FIG. 7 is a cross sectional view along I-I' of FIG. 2, which shows a second modified embodiment of a gas distribution module.

FIG. 7 is a cross sectional view along I-I' of FIG. 2, which shows a second modified embodiment of a gas distribution module.

Referring to FIG. 7 in connection with FIG. 2, each of gas distribution modules 140a, 140b, 140c and 140d according to the second modified embodiment of the present invention may include a housing 141, first and second plasma electrodes 143a and 143b, and first and second insulating members 145a and 145b. Except that each of the first and second plasma electrodes 143a and 143b is not protruding out of a lower surface of a ground electrode 141b, that is, a lower surface of a housing 141, each of the gas distribution modules according to the second modified embodiment of the present invention is identical in structure to that of the gas distribution modules according to the first modified embodiment of the present invention shown in FIG. 6.

In more detail, a height (H2) between the first plasma electrode 143a and the substrate (W) is larger than a height (H1) between the substrate (W) and a ground partition 141b2 for formation of a source gas distribution space (S3). Also, a height (H2) between the second plasma electrode 143b and the substrate (W) is larger than the height (H1) between the substrate (W) and the ground partition 141b2 for formation of the source gas distribution space (S3). Also, a distance (d2) between the first plasma electrode 143a and the ground electrode 141b is smaller than the height (H1) between the substrate (W) and the ground partition 141b2 provided with the source gas distribution space (S3). In this case, the distance (d2) between the first plasma electrode 143a and the ground electrode 141b is relatively smaller than the aforementioned distance (d1) of FIG. 4. In the same manner, the distance (d2) between the second plasma electrode 143b and the ground electrode 141b is relatively smaller than the aforementioned distance (d1) of FIG. 4.

When the plasma formation gas (G1) is supplied to the first and second plasma formation spaces (S1, S2) in each of the gas distribution modules 140a, 140b, 140c and 140d according to the second modified embodiment of the present invention, and the plasma power is applied to the first and second plasma electrodes 143a and 143b, the plasma is formed between the lower area of the plasma electrodes 143a and 143b and the lower area of the ground electrode 141b. In this case, first and second plasma areas (PA1, PA2) for formation of the plasma may be overlapped with each other in the lower area of the ground partition 141b2 provided with the source gas distribution space (S3) by an electric field. According as the source gas (G2) distributed from the source gas distribution space (S3) is distributed to the overlapping area of the first and second plasma areas (PA1, PA2) in the lower area of the ground partition 141b2, the source gas (G2) is activated by the plasma in the overlapping area of the first and second plasma areas (PA1, PA2), and then the activated source gas (AG2) is distributed on the substrate (W).

Figure 8:
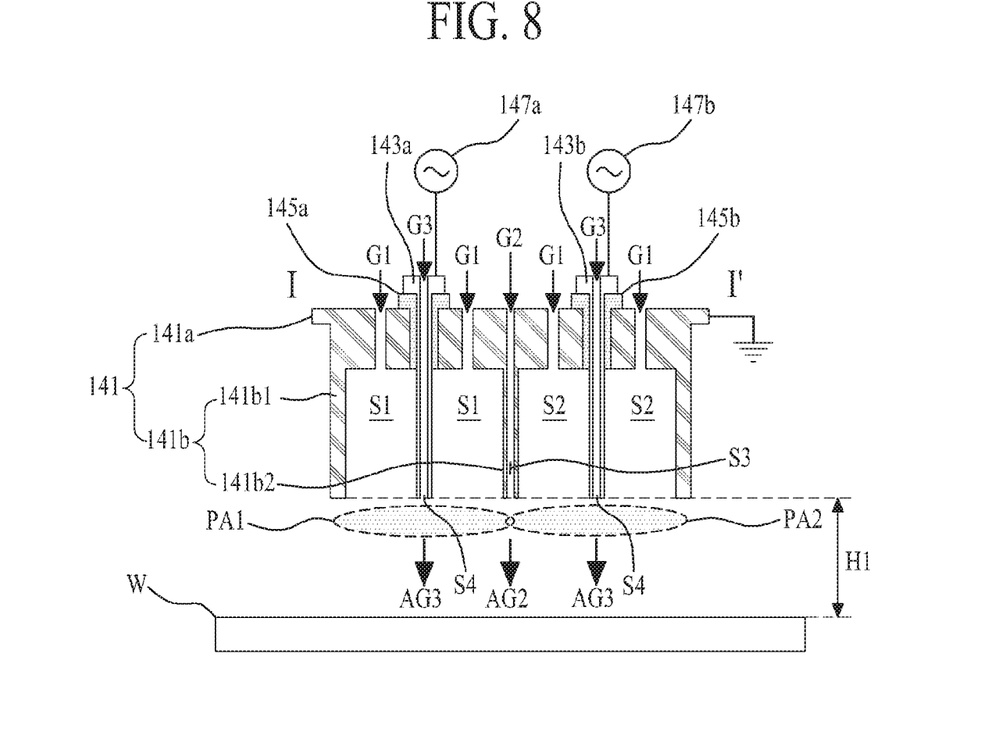
FIG. 8 is a cross sectional view along I-I' of FIG. 2, which shows a third modified embodiment of a gas distribution module.

FIG. 8 is a cross sectional view along I-I' of FIG. 2, which shows a third modified embodiment of a gas distribution module.

Referring to FIG. 8 in connection with FIG. 2, each of gas distribution modules 140a, 140b, 140c and 140d according to the third modified embodiment of the present invention may include a housing 141, first and second plasma electrodes 143a and 143b, and first and second insulating members 145a and 145b. Except that a reactant gas distribution space (S4) is additionally formed inside each of the first and second plasma electrodes 143a and 143b, each of the gas distribution modules according to the third modified embodiment of the present invention is identical in structure to that of the gas distribution modules according to the first modified embodiment of the present invention shown in FIG. 6.

In more detail, the reactant gas distribution space (S4) is formed inside each of the first and second plasma electrodes 143a and 143b, wherein the reactant gas distribution space (S4) is supplied with the aforementioned reactant gas (G3) from a third gas supplier (not shown). In FIG. 8, the reactant gas distribution space (S4) is formed in type of a slit, but not limited to this shape. For example, a lower surface of the reactant gas distribution space (S4) may include a plurality of source gas distribution holes (not shown).

When plasma formation gas (G1) is supplied to first and second plasma formation spaces (S1, S2) in each of the gas distribution modules 140a, 140b, 140c and 140d according to the third modified embodiment of the present invention, and plasma power is applied to the first and second plasma electrodes 143a and 143b, plasma is formed in the first and second plasma formation spaces (S1, S2), lower areas of the plasma electrodes 143a and 143b, and a lower area of a ground electrode 141b. In this case, each of first and second plasma areas (PA1, PA2) for formation of the plasma may include a lower area of a ground partition 141b2 provided with a source gas distribution space (S3) by an electric field, and a lower area of each of the first and second plasma electrodes 143a and 143b provided with the reactant gas distribution space (S4). According as source gas (G2) distributed from the source gas distribution space (S3) is distributed to an overlapping area of the first and second plasma areas (PA1, PA2), the source gas (G2) is activated by the plasma in the overlapping area of the first and second plasma areas (PA1, PA2), and then the activated source gas (AG2) is distributed on the substrate (W). Also, according as the reactant gas (G3) distributed from the reactant gas distribution space (S4) is distributed to each of the first and second plasma areas (PA1, PA2) formed in the lower area of each plasma electrode 143a and 143b, the reactant gas (G3) is activated by the plasma of each of the first and second plasma areas (PA1, PA2), and then the activated reactant gas (AG3) is distributed on the substrate (W).

In each of the gas distribution modules 140a, 140b, 140c and 140d according to the third modified embodiment of the present invention, each of the plasma electrodes 143a and 143b and the ground electrode 141b is provided at the same height (H1) from the substrate (W), but not limited to this structure. For example, as shown in the gas distribution module according to the aforementioned second modified embodiment of FIG. 7, any one of the plasma electrodes 143a and 143b and the ground electrode 141b may be more adjacent to the substrate (W). In this case, it is preferable that the source gas (G2) be distributed from the gas distribution space (S3, S4) formed inside the plasma electrode 143a and 143b or the ground electrode 141b, which is positioned more adjacent to the substrate (W). For example, if the ground electrode 141b is positioned more adjacent to the substrate (W) in comparison to the plasma electrode 143a and 143b, the source gas (G2) is distributed from the gas distribution space (S3) formed inside the ground electrode 141b, and the reactant gas (G3) is distributed from the gas distribution space (S4) formed inside the plasma electrode 143a and 143b. Meanwhile, if the plasma electrode 143a and 143b is positioned more adjacent to the substrate (W) in comparison to the ground electrode 141b, the reactant gas (G3) is distributed from the gas distribution space (S3) formed inside the ground electrode 141b, and the source gas (G2) is distributed from the gas distribution space (S4) formed inside the plasma electrode 143a and 143b.

As shown above, the substrate processing apparatus and method according to the embodiment of the present invention enables to form the plasma in each of the first and second plasma formation spaces (S1, S2) spatially separated from each other, to activate the source gas (G2) by distributing the source gas (G2) to some of the plasma area through the use of source gas distribution space (S3) partially overlapped with some of the plasma area for formation of the plasma, and to distribute the activated source gas (AG2) on the substrate (W), thereby improving deposition uniformity of thin film deposited on the substrate (W), facilitating quality control of thin film, and minimizing particles by realizing a minimum accumulation thickness of particles deposited on a process chamber.

Also, the substrate processing apparatus and method according to the embodiment of the present invention enables to form the plasma in each of the first and second plasma formation spaces (S1, S2) spatially separated from each other, to activate the source gas (G2) and reactant gas (G3) by distributing the source gas (G2) and reactant gas (G3) to some of the plasma area through the use of source gas distribution space (S3) and reactant gas distribution space (S4) partially overlapped with some of the plasma area for formation of the plasma, and to distribute the activated source gas (AG2) and reactant gas (AG3) on the substrate (W), thereby improving deposition uniformity of thin film deposited on the substrate (W), facilitating quality control of thin film, and minimizing particles by realizing a minimum accumulation thickness of particles deposited on a process chamber.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing method comprising:
   placing at least one substrate on a substrate supporter provided inside a process chamber; and
   locally distributing activated source gas on the substrate using a gas distributor which locally confronts the substrate supporter and is provided in a chamber lid for covering the process chamber,
   wherein the gas distributor forms plasma using a plasma formation gas, and distributes a source gas to a plasma overlapping area for formation of the plasma, and thus activates the source gas,
   wherein the gas distributor includes first and second plasma formation spaces which are spatially separated from each other, and are supplied with the plasma formation gas; and a source gas distribution space provided between the first and second plasma formation spaces to separate the first and second plasma formation spaces from each other, and is supplied with the source gas,
   wherein the source gas is activated by plasma to include some of a lower area of the source gas distribution space,
   wherein the gas distributor includes a plurality of ground electrodes to spatially separate the first and second plasma formation space from the source gas distribution space, and first and second plasma electrodes respectively inserted into the first and second plasma formation spaces,
   wherein locally distributing the activated source gas on the substrate includes:
      supplying plasma formation gas to each of the first and second plasma formation spaces;
      forming plasma to include some of a lower area of the source gas distribution space by supplying plasma power to the first and second plasma electrodes; and
      distributing the source gas to a plasma formation area formed in the lower area of the source gas distribution space through the source gas distribution space, and activating the source gas.

2. The method of claim 1, wherein a distance between the substrate and a lower surface of each of the first and second plasma electrodes is the same as or different from a distance between the substrate and a lower surface of the plurality of ground electrodes.

3. The method of claim 1, wherein the plasma formation gas is formed of inert gas or reactant gas which reacts with the source gas.

4. The method of claim 1, wherein the source gas includes reactant gas which reacts with the source gas.

5. The method of claim 1, further comprising distributing a reactant gas, which reacts with the source gas, to the plasma formation area formed to include some of a lower area of a reactant gas distribution space, through the reactant gas distribution space penetrating through each of the first and second plasma electrodes, activating the reactant gas, and distributing the activated reactant gas on the substrate.

6. A substrate processing method comprising:
   placing at least one substrate on a substrate supporter provided inside a process chamber; and
   locally distributing activated source gas on the substrate using a gas distributor which locally confronts the substrate supporter and is provided in a chamber lid for covering the process chamber,
   wherein the gas distributor forms plasma using a plasma formation gas, and distributes a source gas to a plasma overlapping area for formation of the plasma, and thus activates the source gas,
   wherein the gas distributor includes first and second plasma formation spaces which are spatially separated from each other, and are supplied with the plasma formation gas; and a source gas distribution space which is provided between the first and second plasma formation spaces to separate the first and second plasma formation spaces from each other, and is supplied with the source gas,
   wherein the source gas is activated by plasma to include some of a lower area of the source gas distribution space,
   wherein the gas distributor includes a plurality of ground electrodes to spatially separate the first and second plasma formation space from each other, first and second plasma electrodes respectively inserted into the first and second plasma formation spaces, and the source gas distribution space penetrating through a ground partition for spatially separating the first and second plasma formation spaces from each other, wherein locally distributing the activated source gas on the substrate includes:

supplying plasma formation gas to each of the first and second plasma formation spaces;

forming plasma to include some of a lower area of the source gas distribution space by supplying plasma power to the first and second plasma electrodes; and distributing the source gas to a plasma formation area formed in the lower area of the source gas distribution space through the source gas distribution space, and activating the source gas.

7. The method of claim 6, wherein a distance between the substrate and a lower surface of each of the first and second plasma electrodes is the same as or different from a distance between the substrate and a lower surface of the plurality of ground electrodes.

8. The method of claim 6, wherein the plasma formation gas is formed of an inert gas or a reactant gas which reacts with the source gas.

9. The method of claim 6, wherein the source gas includes a reactant gas which reacts with the source gas.

10. The method of claim 6, further comprising distributing a reactant gas, which reacts with the source gas, to the plasma formation area formed to include some of a lower area of a reactant gas distribution space, through the reactant gas distribution space penetrating through each of the first and second plasma electrodes, activating the reactant gas, and distributing the activated reactant gas on the substrate.

* * * * *